(12) United States Patent
Lee

(10) Patent No.: US 7,551,108 B1
(45) Date of Patent: Jun. 23, 2009

(54) INVERTER SYSTEM WITH INPUT SIGNAL-PROCESSING APPARATUS AND METHOD FOR THE SAME

(75) Inventor: Min-Jon Lee, Taoyuan Shien (TW)

(73) Assignee: Delta Electronics, Inc., Taoyuan Shien (TW)

( * ) Notice: Subject to any disclaimer, the term of this patent is extended or adjusted under 35 U.S.C. 154(b) by 0 days.

(21) Appl. No.: 12/023,452

(22) Filed: Jan. 31, 2008

(51) Int. Cl.
*H03M 1/06* (2006.01)

(52) U.S. Cl. .................. 341/118; 341/117; 341/119; 341/155

(58) Field of Classification Search ......... 341/117–120, 341/155, 139; 363/131, 95, 17, 41
See application file for complete search history.

(56) References Cited

U.S. PATENT DOCUMENTS 5,742,496 A * 4/1998 Tsutsumi ............... 363/95
6,169,670 B1 * 1/2001 Okubo et al. ............ 363/41
2005/0281067 A1 * 12/2005 Deng et al. ............. 363/131
2007/0247876 A1 * 10/2007 Garabandic ............. 363/17

* cited by examiner

*Primary Examiner*—Jean B Jeanglaude

(57) ABSTRACT

An Inverter system includes a comparator unit compares an analog input voltage with at least one voltage threshold to judge a voltage range for the input voltage. A DC-offset unit determines a DC-offset value to limit the input voltage within a predetermined bound. The input voltage is level-shifted and amplified by a non-inverting adder unit according to the DC-offset value and a fixed gain, and then processed by an analog to digital converter (ADC) to obtain a digital count value. A microcontroller unit calculates an original value for the input analog voltage according to the voltage range and the digital count value. When the analog input voltage could be negative value, a full-wave rectifier unit and a polarity judgment unit are used to find an absolute value and a polarity of the analog input voltage for further processing.

18 Claims, 5 Drawing Sheets

INVERTER SYSTEM WITH INPUT SIGNAL-PROCESSING APPARATUS AND METHOD FOR THE SAME

BACKGROUND OF THE INVENTION

1. Field of the Invention

The present invention relates to an inverter system, especially to an inverter system with input signal-processing apparatus and method for the same.

2. Description of Prior Art

An inverter is used to convert the direct current (DC) power to the alternating current (AC) power. Therefore, the inverters have been widely applied in solar electricity generating system, motor scooter, uninterruptible power supply, and so on. In an inverter, a voltage/frequency (V/f) control is used to provide variable speed control for motors and consequently inverters can be advantageously applied in refrigeration, air conditioning system, high speed rail system, mass rapid transit system to promote use efficiency of motors so as to increase energy efficiency.

FIG. 1 is a prior art block diagram of an inverter system. A host 10A delivers an analog control signal to an inverter 30A through an analog input/output module 20A. The inverter 30A includes an analog to digital converter (not shown) to convert the analog control signal into a digital signal, which is processed by a microcontroller unit 300A to control the inverter 30A.

At present, the inverters provide control on the frequency of output voltage according to an analog input voltage (such as with range from −10 to 10 volts). However, the analog input voltage has to be processed through a proportional amplifier and then sent into analog input pins of the microcontroller unit 300A. Generally speaking, an operating voltage of the microcontroller unit 300A is +5 volts or +3.3 volts, therefore, the proportional gain is usually a fixed less-than-one value.

FIG. 2 is a prior art circuit diagram for processing an analog input signal of an analog input/output module. The analog input voltage signal $V_{AI}$ (−10V to 10 volts) is proportionally transferred into a voltage −2.5V~+2.5V through a non-inverting amplifier 22A with a fixed proportional gain P (P=0.25) and the transferred voltage is sent into a DC offset unit 23A, which provides 2.5V DC offset to clamp the transferred voltage to +0~+5V. The clamped voltage is sent to analog input pins of the microcontroller unit 300A and converted by the analog-to-digital converter unit 24A.

FIG. 3 shows a conversion result performed by the circuit in FIG. 2, wherein an analog input voltage signal is converted into a digital count value with 10-bit resolution. A voltage variation is 5 milli volts (mV) (see formula 1) for a least significant bit (LSB) of the analog-to-digital converter unit 24A when a reference voltage $V_{REF}$ thereof is 5.12 volts. If an error of the analog-to-digital converter unit 24A is ±3 LSB, a digital count value N acquired by the microcontroller unit 300A is 550±3 (see formula 2) when the analog input voltage signal is 1.00 volt.

A width of the LSB is 5 mV:

$$\frac{5.12(\text{volt})}{1024} = 5(\text{mV}) \quad \text{(formula 1)}$$

The digital count value N is calculated:

$$N = (V_{AI} \times P + 2.5) \times \frac{1024}{V_{REF}} = \left(1 \times \frac{1}{4} + 2.5\right) \times \frac{1024}{5.12} = 550 \quad \text{(formula 2)}$$

Hence, the analog input voltage signal $V_{AI}$ can be inversely calculated from the digital count value N:

$$V_{AI} = \frac{(N \times V_{REF}/1024) - 2.5}{P} \pm \frac{(3 + 1/2) \times V_{REF}/1024}{P} \quad \text{(formula 3)}$$

The analog input voltage signal is 1±0.07 volts when the digital count value N acquired by the microcontroller unit 300A is 550. The error of the microcontroller unit 300A is amplified due to the fixed proportional gain P (P=0.25<1), therefore, a maximum error is 0.07 volts. The error rate increases when the analog input voltage is lower; in other word, the accuracy rate decreases when the analog input voltage is lower so that microcontroller unit 300A cannot be accurately controlled.

Table 1 shows that the accuracy rate of the microcontroller unit 300A gradually decreases when the analog input voltage decreases.

| Error rate and accuracy rate of the microcontroller for estimating an analog input voltage signal | | |
|---|---|---|
| Analog input voltage signal ($V_{AI}$) | Error rate of the microcontroller | Accuracy rate of the microcontroller |
| 1.00 | 7.0% | 93.0% |
| 0.80 | 8.75% | 91.25% |
| 0.60 | 11.7% | 88.3% |
| 0.40 | 17.5% | 82.5% |
| 0.20 | 35.0% | 65.0% |
| 0.10 | 70.0% | 30.0% |

SUMMARY OF THE INVENTION

It is an object of the present invention to provide an inverter system with input signal-processing apparatus having high precision and method for the same.

Accordingly, the present invention provides an inverter system with input signal-processing apparatus. The inverter system includes a comparator unit, a non-inverting adder unit, a DC-offset unit, an analog to digital converter (ADC) and a microcontroller unit. The comparator unit compares an input analog voltage with at least one voltage threshold to judge a voltage range for the input analog voltage. The DC-offset unit determines a DC-offset value to limit the input analog voltage within a predetermined bound. The input voltage is level-shifted and amplified by the non-inverting adder unit according to the DC-offset value and a fixed gain, and then processed by the ADC to obtain a digital count value. The microcontroller unit calculates an original value for the input analog voltage according to the voltage range and the digital count value. When the analog input voltage could be negative value, a full-wave rectifier unit and a polarity judgment unit are used to find an absolute value and a polarity of the analog input voltage for further processing. The microcontroller unit calculates the value for the original input analog voltage according to the polarity and the information based on the absolute value of the input analog voltage to simplify circuit.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
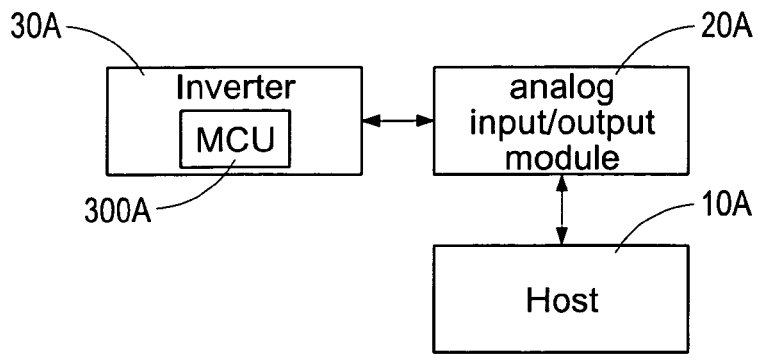
FIG. 1 is a prior art block diagram of an inverter system.
Figure 2:
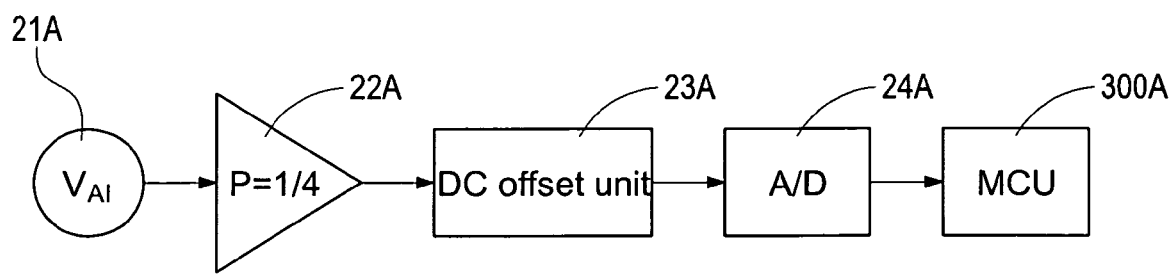
FIG. 2 is a prior art circuit diagram for processing an analog input signal of an analog input/output module.
Figure 3:
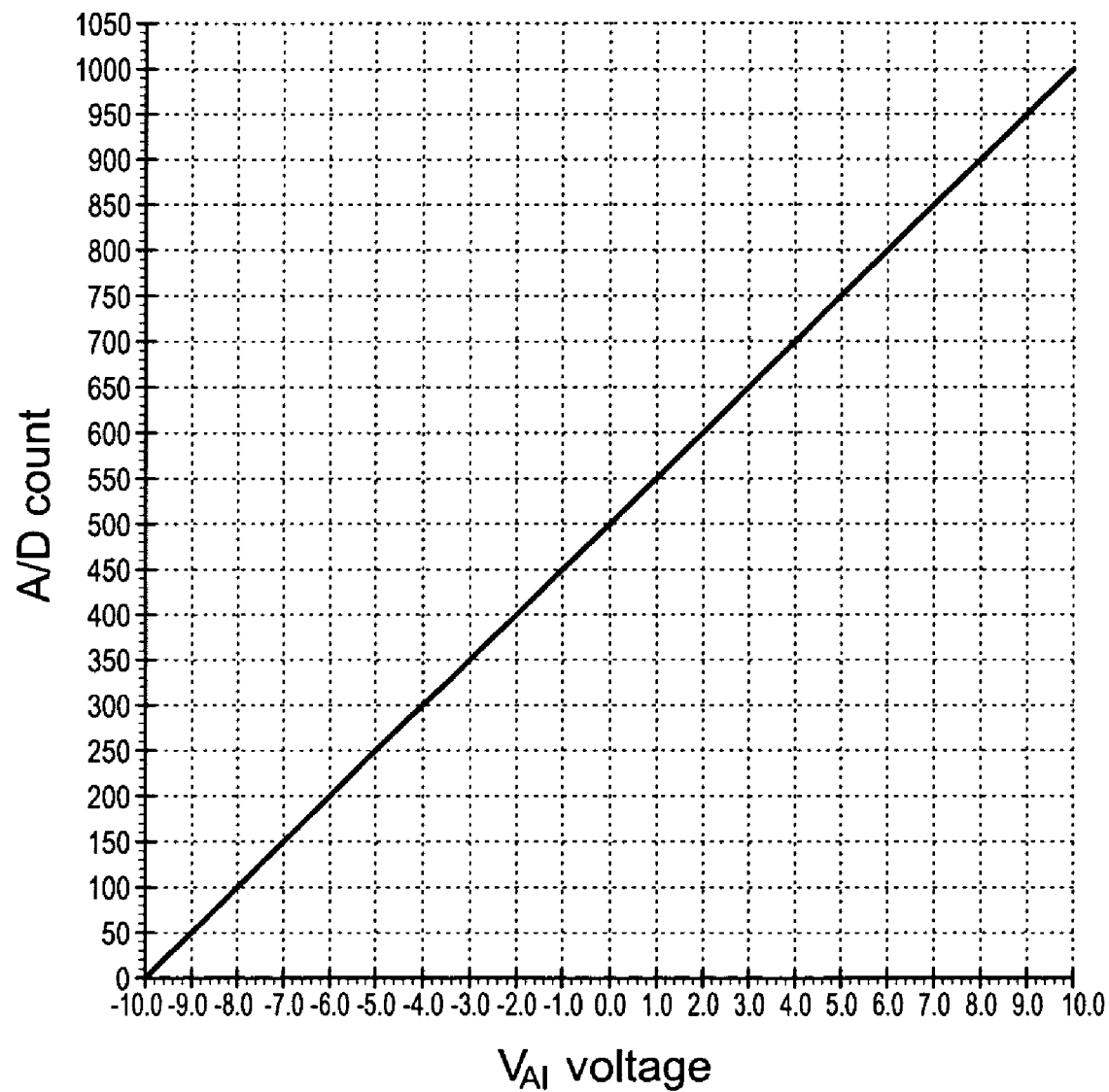
FIG. 3 shows a conversion result performed by the circuit in FIG. 2, wherein an analog input voltage signal is converted into a digital count value with 10-bit resolution.
Figure 4A:
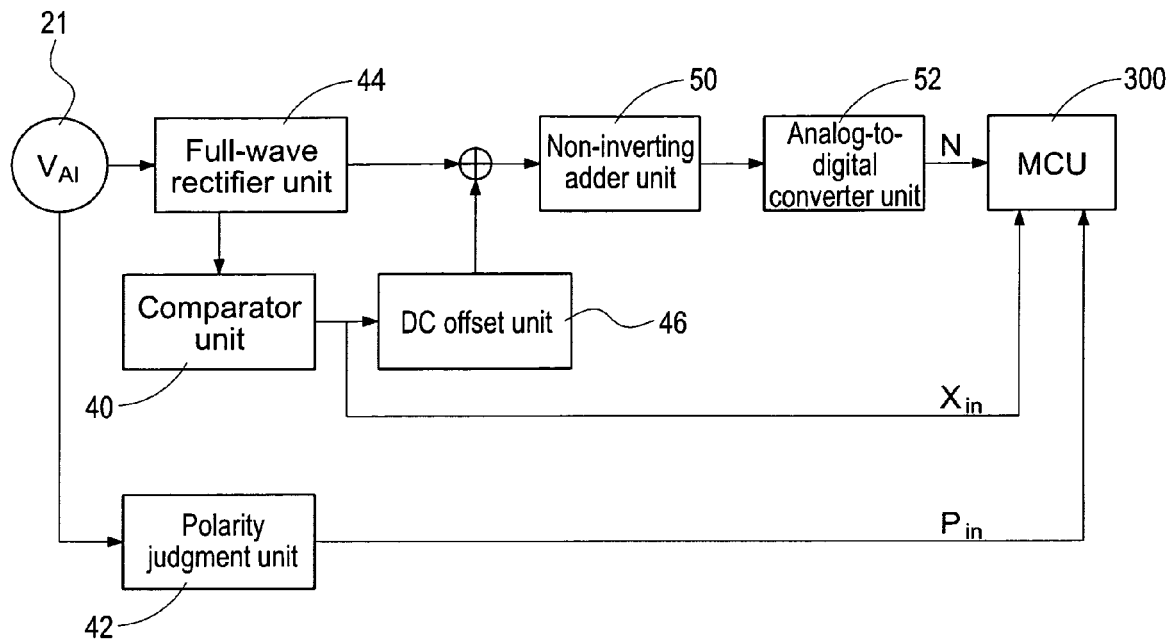
FIG. 4A is a block diagram of a preferred embodiment of an inverter system with a high-precision input gain apparatus according to the present invention.

FIG. 4A is a block diagram of a preferred embodiment of an inverter system with a high-precision input gain apparatus according to the present invention. An analog input voltage signal $V_{AI}$ is amplified by a variable gain unit and processed by an analog-to-digital converter. A microcontroller unit 300 receives a digital count value N (the digital count value N is deduced from an analog input voltage signal VA after fixed-gain amplification, DC offset adjustment and analog-to-digital conversion), an indicating signal Xin and a polarity signal Pin to accurately calculate an original value of the analog input voltage signal $V_{AI}$. The inverter system further comprises a comparator unit 40, a polarity judgment unit 42, a precise full-wave rectifier unit 44, a DC offset unit 46, a non-inverting adder unit 50 and an analog-to-digital converter unit 52.

The polarity judgment unit 42 receives the input voltage signal $V_{AI}$ and judges a polarity of the analog input voltage signal $V_{AI}$. The polarity judgment unit 42 sends a polarity signal Pin to the MCU 300 for indicating the polarity of the analog input voltage signal $V_{AI}$.

The full-wave rectifier 44 receives the analog input voltage signal $V_{AI}$ and rectifies the analog input voltage signal $V_{AI}$ in to an absolute voltage $|V_{AI}|$. The comparator unit 40 compares the absolute voltage with at least one threshold voltage to determine a voltage range for the absolute voltage. The comparator unit 40 sends the information of the voltage range to the DC offset unit 46, and output an indicating signal Xin for indicating the voltage range for the absolute voltage to the MCU 300.

The DC offset unit 46 generates a DC offset value according to the voltage range for the absolute voltage, which is output from the comparator unit 40. The DC offset value is used to limit the absolute voltage to a predetermined bound, for example, 0-2V. Provided that the voltage range for the absolute voltage is 2-4V, the DC offset value is −2V; provided that the voltage range for the absolute voltage is 6-8V, the DC offset value is −6V.

The non-inverting adder unit 50 comprises a non-inverting adder and an amplifier with fixed gain. The non-inverting adder unit 50 adjusts the level of the absolute voltage according to the DC offset value such that the level-adjusted absolute voltage is within the predetermined bound (0-2V). The level-adjusted absolute voltage is then amplified by the amplifier with fixed gain (for example, P=2.5). The level-adjusted and amplified absolute voltage is processed by the analog-to-digital converter unit 52 to generate a digital count value N. The digital count value N is sent to the MCU 300 for processing.

Figure 4B:
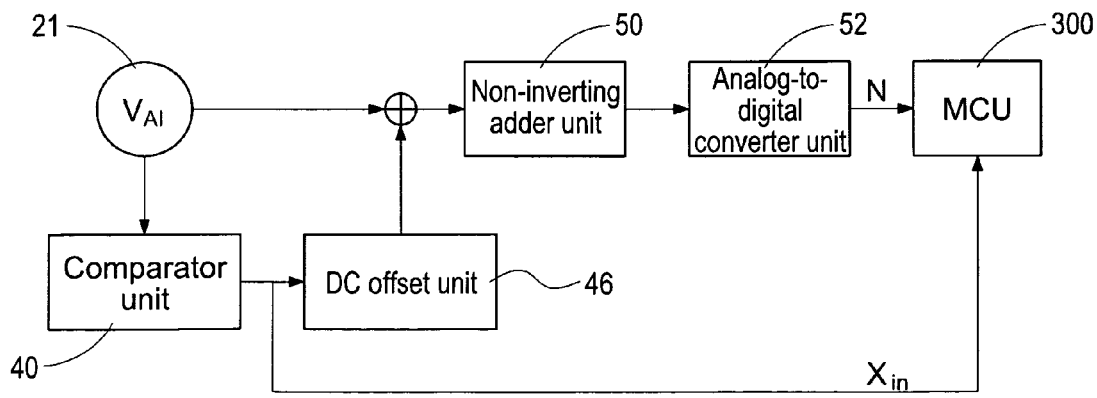
FIG. 4B shows the block diagram of the inverter system with high-precision input signal-processing apparatus according to another preferred embodiment of the present invention.

FIG. 4B shows the block diagram of the inverter system with high-precision input signal-processing apparatus according to another preferred embodiment of the present invention. When the input voltage signal $V_{AI}$ is always positive, the polarity judgment unit 42 and the precise full-wave rectifier 44 can be saved. The comparator unit 40 compares the analog input voltage signal $V_{AI}$ with at least one threshold voltage to determine a voltage range for the analog input voltage signal $V_{AI}$. The comparator unit 40 sends the information of the voltage range to the DC offset unit 46, and output an indicating signal $X_{in}$ for indicating the voltage range for the analog input voltage signal $V_{AI}$ to the MCU 300. The DC offset unit 46 generates a DC offset value according to the voltage range for the analog input voltage signal $V_{AI}$, which is output from the comparator unit 40. The DC offset value is used to adjust a level of the analog input voltage signal $V_{AI}$ to limit the analog input voltage signal $V_{AI}$ to a predetermined bound, for example, 0-2V. The non-inverting adder unit 50 comprises a non-inverting adder and an amplifier with fixed gain. The non-inverting adder unit 50 adjusts the level of the analog input voltage signal $V_{AI}$ according to the DC offset value such that the level-adjusted voltage is within the predetermined bound (0-2V). The level-adjusted voltage is then amplified by the amplifier with fixed gain (for example, P=2.5). The level-adjusted and amplified voltage is processed by the analog-to-digital converter unit 52 to generate a digital count value N. The digital count value N is sent to the MCU 300 for processing.

Figure 5:
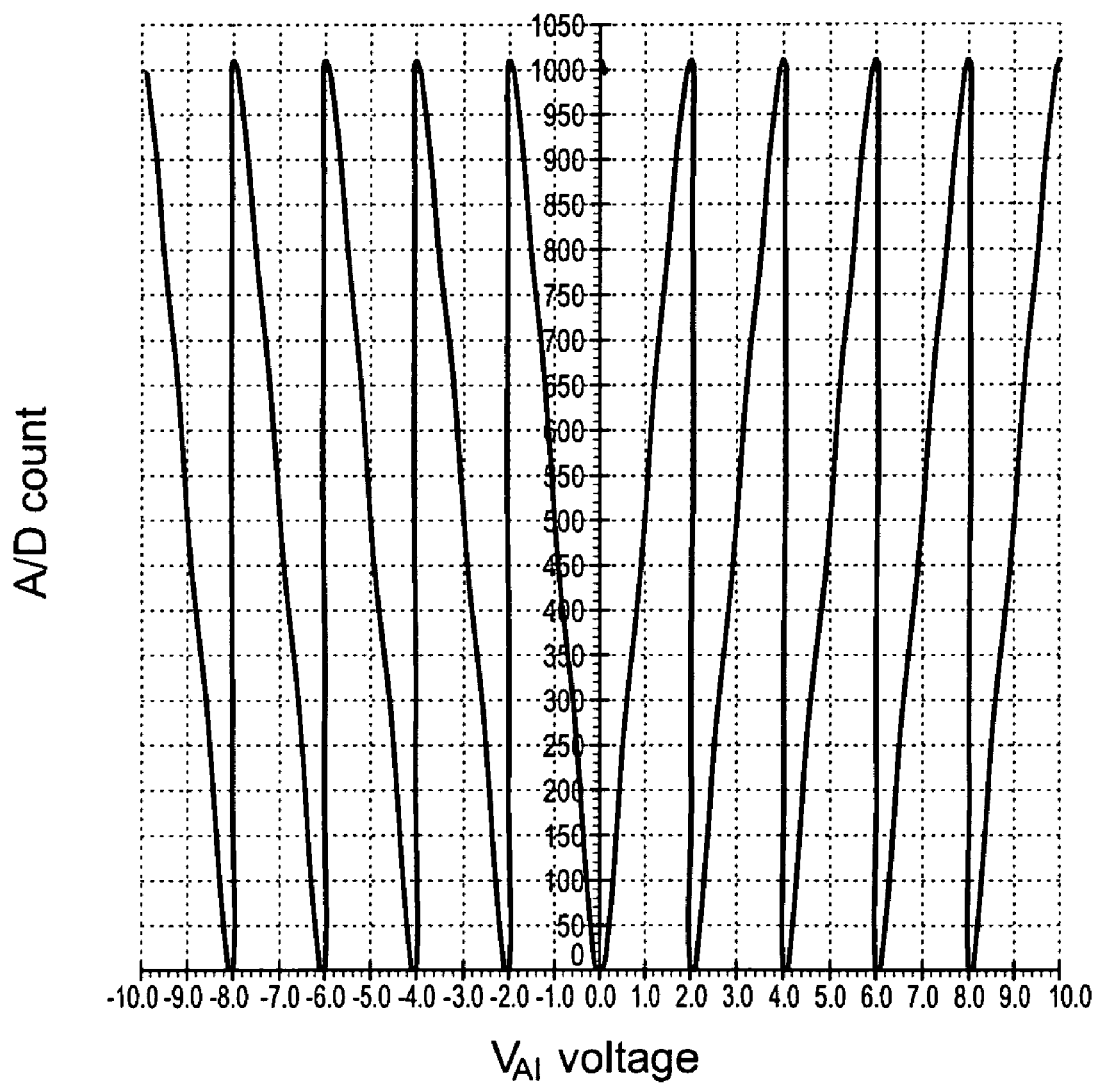
FIG. 5 is a conversion result of converting analog input voltage signal into a digital count value N by input processing apparatus shown in FIG. 4A.

FIG. 5 is a conversion result of converting analog input voltage signal into a digital count value N by input processing apparatus shown in FIG. 4A. The full-wave rectifier 44 takes absolute value for the input voltage signal $V_{AI}$; therefore, it is sufficient to consider the positive part (0~+10V) of the input voltage signal $V_{AI}$ and the negative part (−10V~0V) of the input voltage signal $V_{AI}$ can be treated by symmetric viewpoint. In following illustration, the positive half swing voltage is divided into five voltage ranges (0-2, 2-4, 4-6, 6-8, 8-10V) by 4 threshold voltages (2V, 4V, 6V, 8V), and the digital count value N is expressed by 10 bit values (0-1023). When the voltage range of the analog input voltage signal $V_{AI}$ is 0~+2V, the amplification gain is 2.5 and no DC offset is required. When the voltage range of the analog input voltage signal $V_{AI}$ is +2V~+4V, the DC offset value provided by the DC offset unit 46 is −2V.

The non-inverting adder unit 50 first performs an adding operation for the input voltage signal $V_{AI}$ with the DC offset value such that the level adjusted voltage is 0~2V (within the predetermined bound). The amplification gain is still 2.5. In other word, the resolution is enhanced by 10 times and the precision for detecting the input voltage signal $V_{AI}$ for MCU is enhanced. More particularly, the resolution per 1 LSB is enhanced from 20 mV to 2 mV. When the MCU 300 receives a digital count value N of 500 from the analog-to-digital converter unit 52, the possible original values for the analog input voltage signal $V_{AI}$ can be in one of the ranges of −9V, −7V. +7V, +9V. The MCU 300 knows the polarity of the input voltage signal $V_{AI}$ from the polarity signal Pin and knows the voltage range of the input voltage signal $V_{AI}$ by the indicating signals Xin. Therefore, the MCU 300 can precisely estimate the original value of the analog input voltage signal $V_{AI}$.

Figure 6:
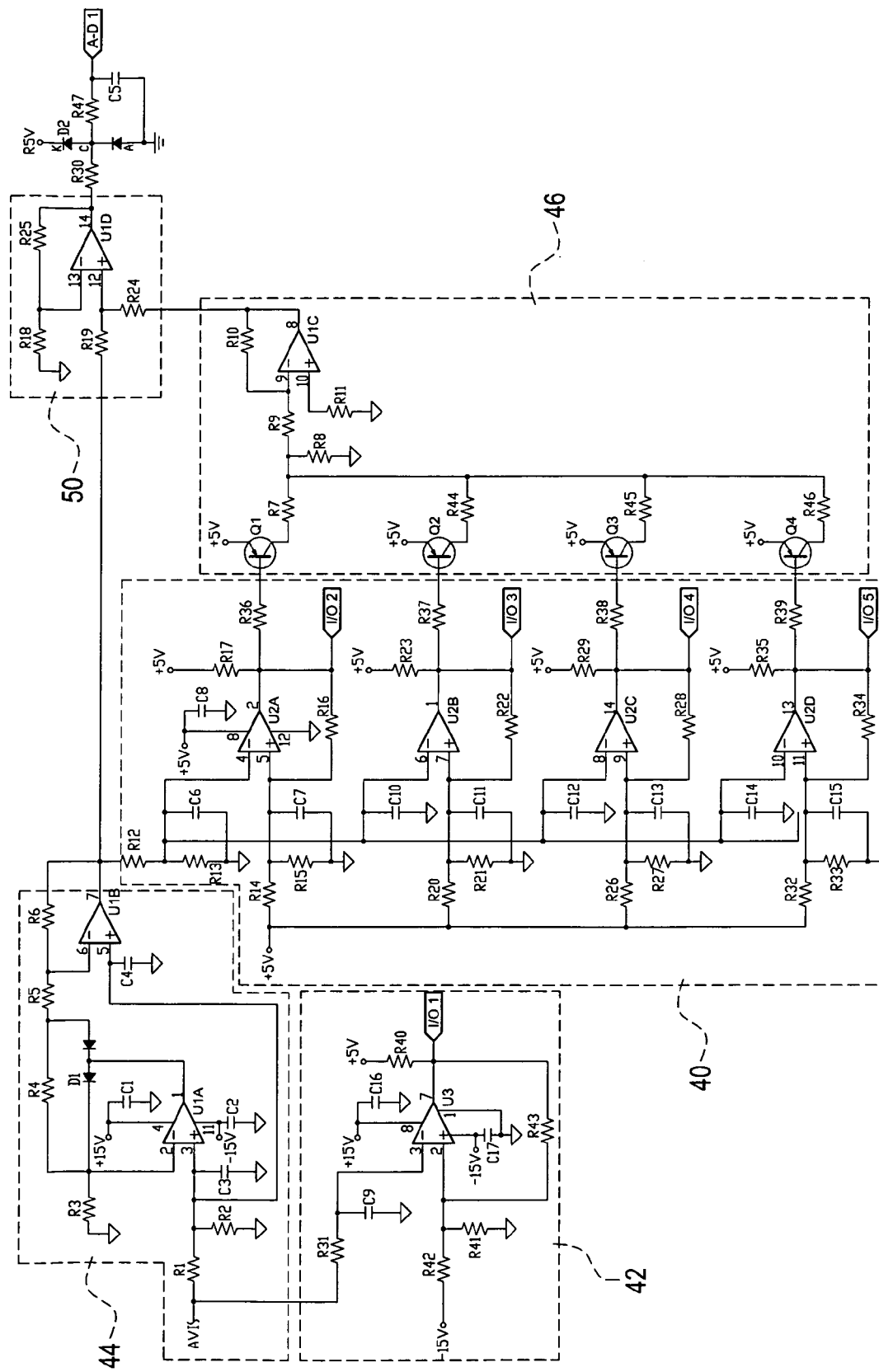
FIG. 6 is a circuit diagram for implementing the inverter system with the input processing apparatus of the FIG. 4A.

FIG. 6 is a circuit diagram for implementing the inverter system with the input processing apparatus of the FIG. 4A. The full-wave rectifier 44 can be realized by amplifier U1A and U1B and rectifying diodes. The comparator unit 40 can be realized, for example, comparator IC LM 239 to compare the absolute voltage |V$_{AI}$| with predetermined threshold voltages to generate indicating signals Xin (the signals I/O2~I/O5 shown in this figure). The polarity judgment unit 42 can be implemented by a comparator (LM 311) and generates a polarity signal Pin (the signal I/O1 shown in this figure). The DC offset unit 46 can be implemented by four PNP transistors (Q1-Q4) and impedance-matched resistors and amplifier U1C. The four PNP transistors (Q1-Q4) are controlled by the output of the comparator unit 40. The non-inverting adder unit 50 is implemented by an amplifier U1D and impedance-matched resistors.

Table 2 shows an operating result of the inverter system with the input processing apparatus according to the present invention, wherein the error is assumed to be ±3 LSB.

TABLE 2

Error rate and accuracy rate of the microcontroller for estimating an analog input voltage signal

| Analog input voltage signal (V$_{AI}$) | Error rate of the microcontroller | Accuracy rate of the microcontroller |
|---|---|---|
| 1.00 | 0.7% | 99.3% |
| 0.80 | 0.9% | 99.1% |
| 0.60 | 1.2% | 98.8% |
| 0.40 | 1.8% | 98.3% |
| 0.20 | 3.5% | 96.5% |
| 0.10 | 7.0% | 93.0% |

It follows from what has been said that the present invention has the following advantages:
1. The resolution for MCU is enhanced by 10 times.
2. Accuracy rate of estimating small analog input voltage signal is raised.
3. Control precision by external analog signal is enhanced.
4. Efficiency of the firmware filtering is enhanced.
5. The circuit structure is simple to easily implement.
6. Flexible circuit design.
7. A wide scope of application is provided, and full-wave rectifier can be saved when the analog input voltage signal is in the range of 0~10V.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. An input processing apparatus for an inverter system, the input processing apparatus processing an analog input voltage signal and sending a processing result to the inverter system, the input processing apparatus comprising:
    a comparator unit adapted for comparing the analog input voltage signal with at least one threshold voltage to determine a voltage range for the analog input voltage signal;
    a DC offset unit adapted for providing a DC offset value to the analog input voltage signal according to the voltage range; and
    a non-inverting adder unit adapted for performing an adding operation to the analog input voltage signal with the DC offset value such that the analog input voltage signal is adjusted to be within a predetermined bound, and then the non-inverting adder unit amplifying the adjusted voltage with a fixed gain.

2. The apparatus in claim 1, further comprising:
    a polarity judgment unit for receiving the analog input voltage signal and judges a polarity of the analog input voltage signal; and
    a full-wave rectifier unit for rectifying the analog input voltage signal to obtain an absolute value for the analog input voltage signal, the full-wave rectifier unit supplying the absolute value to the comparator unit to compare with the threshold voltage.

3. The apparatus in claim 1, wherein the DC offset unit provides the DC offset value to limit the analog input voltage signal to the predetermined bound.

4. The apparatus in claim 1, wherein the comparator unit comprises a plurality of comparators and one input of each comparator receives the analog input voltage signal, and the other input of each comparator receives corresponding threshold voltage.

5. The apparatus in claim 1, wherein the DC offset unit comprises a plurality of transistors, resistors and an amplifier.

6. An inverter system processing an analog input voltage signal, comprising:
    a comparator unit adapted for comparing the analog input voltage signal with at least one threshold voltage to determine a voltage range for the analog input voltage signal;
    a DC offset unit adapted for providing a DC offset value to the analog input voltage signal according to the voltage range;
    a non-inverting adder unit for performing an adding operation to the analog input voltage signal with the DC offset value such that the analog input voltage signal is adjusted to be within a predetermined bound, and then the non-inverting adder unit amplifying the adjusted voltage with a fixed gain;
    an analog to digital converter unit electrically connected to the non-inverting adder unit for performing an analog to digital conversion to an output of the non-inverting adder unit to obtain a digital count value; and
    a microcontroller unit receiving the voltage range of the comparator unit and the digital count value to calculate the analog input voltage signal.

7. The system in claim, 6, further comprising:
    a polarity judgment unit for receiving the analog input voltage signal and judging a polarity of the analog input voltage signal; and
    a full-wave rectifier unit for rectifying the analog input voltage signal to obtain an absolute value for the analog input voltage signal, the full-wave rectifier unit supplying the absolute value to the comparator unit to compare with the threshold voltage.

8. The system in claim 7, wherein the DC offset unit providing the DC offset value to limit the absolute value to the predetermined bound.

9. The system in claim 8, wherein the microcontroller unit further receives the polarity to calculate an original value for the analog input voltage signal.

10. The system in claim 6, wherein the comparator unit comprises a plurality of comparators and one input of each comparator receives the analog input voltage signal, and the other input of each comparator receives corresponding threshold voltage.

11. The system in claim 6, wherein the DC offset unit comprises a plurality of transistors, resistors and an amplifier.

12. A method for processing an input analog voltage signal of an inverter system, comprising:
- a) setting at least one threshold voltage;
- b) determining a voltage range of the analog input voltage signal according to the threshold voltage;
- c) determining a DC offset value for the analog input voltage signal according to the voltage range;
- d) performing an adding operation to the analog input voltage signal to level-adjust the analog input voltage signal to a predetermined bound and amplifying the level-adjusted voltage by a fixed gain; and
- e) performing analog to digital conversion to the amplified voltage to obtain a digital count value.

13. The method in claim 12, further comprising:
calculating an original value for the input analog input voltage signal by the digital count value and the voltage range.

14. The method in claim 12, further comprising:
determining a polarity of the input analog voltage signal before step b); and
full-wave rectifying the input analog voltage signal to obtain an absolute value for the input analog voltage signal.

15. The method in claim 14, further comprising:
- b1) determining a voltage range for the absolute value for the input analog voltage signal; and
- c1) level-adjusting the absolute value according to the voltage range for the absolute value.

16. The method in claim 15, further comprising:
- d1) amplifying the level-adjusted absolute value; and
- e1) performing analog to digital conversion to the amplified voltage obtained in step d1) to obtain a digital count value.

17. The method in claim 12, wherein an amplifying gain in step d is larger than 1.

18. The method in claim 17, wherein an amplifying gain in step d) is 2.5.

* * * * *